United States Patent
Tahara (10) Patent No.: US 11,329,675 B2
(45) Date of Patent: May 10, 2022

(54) RADIO FREQUENCY MODULE AND COMMUNICATION DEVICE

(71) Applicant: Murata Manufacturing Co., Ltd., Kyoto (JP)

(72) Inventor: Kenji Tahara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/071,112

(22) Filed: Oct. 15, 2020

(65) Prior Publication Data
US 2021/0028798 A1 Jan. 28, 2021

Related U.S. Application Data

(63) Continuation of application No. PCT/JP2019/014578, filed on Apr. 2, 2019.

(30) Foreign Application Priority Data

Jul. 19, 2018 (JP) .............................. JP2018-135476

(51) Int. Cl.
*H04B 1/00* (2006.01)
*H03H 7/46* (2006.01)
(Continued)

(52) U.S. Cl.
CPC ............... *H04B 1/006* (2013.01); *H03H 7/46* (2013.01); *H03H 7/465* (2013.01);
(Continued)

(58) Field of Classification Search
CPC .......... H03H 7/46; H03H 7/465; H04B 1/005; H04B 1/0053; H04B 1/0057; H04B 1/006;
(Continued)

(56) References Cited

U.S. PATENT DOCUMENTS 8,232,808 B2 * 7/2012 Kimura ............ G01R 31/31924
324/537
2009/0230978 A1 9/2009 Kimura et al.
(Continued)

FOREIGN PATENT DOCUMENTS

JP 2003-318715 A 11/2003
JP 2013-110619 A 6/2013
(Continued)

OTHER PUBLICATIONS

International Search Report for PCT/JP2019/014578 dated Jun. 18, 2019.
(Continued)

*Primary Examiner* — Young T. Tse
(74) *Attorney, Agent, or Firm* — Pearne & Gordon LLP (57) ABSTRACT

A radio frequency module includes a transmit filter of Band A and Band B, a transmit amplifier, and a switch circuit and can perform CA using a transmit signal of Band A and a receive signal of Band B, a transmit band of Band B including a receive band of Band C. The switch circuit includes a switch switching connection between a common terminal and a first selection terminal, a switch switching connection between the common terminal and a second selection terminal, and a switch switching connection between the second selection terminal and a third selection terminal. The common terminal is connected to the transmit amplifier. The first selection terminal is connected to the transmit filter of Band A. The second selection terminal is connected to the transmit filter of Band B. The third selection terminal is connected to a receive path of Band C.

12 Claims, 7 Drawing Sheets

(51) Int. Cl.
*H04B 1/04* (2006.01)
*H04B 1/401* (2015.01)
*H04B 1/48* (2006.01)

(52) U.S. Cl.
CPC .......... *H04B 1/0053* (2013.01); *H04B 1/0057* (2013.01); *H04B 1/04* (2013.01); *H04B 1/401* (2013.01); *H04B 1/48* (2013.01); *H04B 2001/0408* (2013.01)

(58) Field of Classification Search
CPC .......... H04B 1/0067; H04B 1/04; H04B 1/38; H04B 1/40; H04B 1/401; H04B 1/44; H04B 1/48; H04B 2001/0408
USPC ....... 375/219, 220, 259–262, 265, 267, 297; 370/278, 282, 339; 455/500, 503, 59, 61, 455/63.3, 68, 70, 71, 78, 82–84, 88
See application file for complete search history.

(56) References Cited

U.S. PATENT DOCUMENTS

| | | | |
|---|---|---|---|
| 2014/0321339 A1* | 10/2014 | Pehlke | H04B 1/006 370/281 |
| 2016/0050665 A1* | 2/2016 | Chang | H04L 5/1469 370/280 |
| 2017/0093442 A1* | 3/2017 | Jayaraman | H04W 52/52 |
| 2017/0104509 A1* | 4/2017 | Khlat | H04L 5/001 |
| 2017/0237452 A1* | 8/2017 | Granger-Jones | H04B 1/0057 370/297 |
| 2017/0264336 A1 | 9/2017 | Saji | |
| 2017/0338839 A1* | 11/2017 | Little | H04B 1/56 |
| 2018/0006678 A1* | 1/2018 | Liu | H04L 5/14 |
| 2019/0115947 A1* | 4/2019 | Nosaka | H04B 1/50 |

FOREIGN PATENT DOCUMENTS

| | | |
|---|---|---|
| JP | 2016-042696 A | 3/2016 |
| JP | 2017-168932 A | 9/2017 |
| TW | 201445963 A | 12/2014 |
| WO | 2017/199649 A1 | 11/2017 |

OTHER PUBLICATIONS

Written Opinion for PCT/JP2019/014578 dated Jun. 18, 2019.
Wikipedia, LTE Frequency Bands, Deployments by region, Retrieved from https://en.wikipedia.org/wiki/LTE_frequency_bands#Deployments_by_region on Dec. 7, 2021.
3GPP Technical Specification 36.101, Rel. 17, V17.3, Chapter 5 Operating bands and channel arrangement, Sep. 2021.

* cited by examiner

2 UPLINK 2 DOWNLINK

FIG. 4B

1 UPLINK 2 DOWNLINK

FIG. 5

MODIFIED EXAMPLE 1

FIG. 6

FIG. 7  MODIFIED EXAMPLE 2

FIG. 7a MODIFIED EXAMPLE 3

RADIO FREQUENCY MODULE AND COMMUNICATION DEVICE

CROSS REFERENCE TO RELATED APPLICATION

This is a continuation of International Application No. PCT/JP2019/014578 filed on Apr. 2, 2019 which claims priority from Japanese Patent Application No. 2018-135476 filed on Jul. 19, 2018. The contents of these applications are incorporated herein by reference in their entireties.

BACKGROUND

The present disclosure relates to radio frequency modules and communication devices.

In recent communication services, carrier aggregation (hereinbelow, referred to as CA) is performed using a plurality of communication bands simultaneously with a goal of increasing the communication throughput.

A radio frequency module capable of performing CA using two communication bands (for example, Japanese Unexamined Patent Application Publication No. 2016-42696) includes, for example, a filter whose pass band is a first frequency band (for example, Band 39), a filter whose pass band is a second frequency band (for example, Band 41), a switch circuit that switches between a transmit path and a receive path, and a transmit amplifier. According to this configuration, with switching operations of the foregoing switch circuit, it becomes possible to perform CA using at least one of a transmit signal and a receive signal of the first frequency band and at least one of a transmit signal and a receive signal of the second frequency band.

BRIEF SUMMARY

In the radio frequency module described in Japanese Unexamined Patent Application Publication No. 2016-42696, the filters are respectively installed for the communication bands to be used irrespective of an inclusion relationship and an overlapping relationship of frequencies among different communication bands. However, for example, in a system that uses two or more communication bands, in the case where a receive band of a first communication band is included in a transmit band of a second communication band, it is conceivable to use a transmit filter of the second communication band also as a receive filter of the first communication band for downsizing. This eliminates the necessity to install a dedicated filter for the receive band of the first communication band and enables to achieve the downsizing of the radio frequency module.

However, in this case, a receive filter of a third communication band is a filter that allows a receive signal to pass. Therefore, when the third communication band is used, it is suitable to connect the transmit filter of the second communication band and a receive amplifier. Here, when CA is performed using a transmit signal of the first communication band and a receive signal of the third communication band, it is suitable to, using the switch circuit, connect the transmit amplifier and a transmit filter of the first communication band and connect the receive amplifier and the transmit filter of the second communication band. At this time, there is a possibility that a transmit signal from the transmit amplifier may be leaked into the foregoing receive amplifier via the switch circuit. Because of this, there is a problem of decreasing reception sensitivity even when downsizing of the radio frequency module is achieved.

The present disclosure provides a radio frequency module and a communication device, each of which is capable of performing CA using a plurality of communication bands including two communication bands in which a transmit band of one of the two communication bands and a receive band of the other communication band are in an inclusion relationship and in which the decrease in reception sensitivity is suppressed while downsizing.

A radio frequency module according to one aspect of the present disclosure is a radio frequency module that transmits radio frequency signals of a first communication band, a second communication band, and a third communication band, which are frequency bands different from one another, a transmit band of the second communication band including a receive band of the third communication band, a transmit signal of the first communication band and a receive signal of the third communication band being able to be simultaneously transmitted and received, the radio frequency module including: a first transmit filter whose pass band is a transmit band of the first communication band; a second transmit filter whose pass band is the transmit band of the second communication band; a transmit amplifier that amplifies radio frequency signals of the transmit band of the first communication band and the transmit band of the second communication band; and a first switch circuit, wherein the first switch circuit includes a first common terminal, a first selection terminal, a second selection terminal, and a third selection terminal, a first switch that switches between being electrically continuous and electrically discontinuous between the first common terminal and the first selection terminal, a second switch that switches between being electrically continuous and electrically discontinuous between the first common terminal and the second selection terminal, and a third switch that switches between being electrically continuous and electrically discontinuous between the second selection terminal and the third selection terminal, the first common terminal is connected to an output terminal of the transmit amplifier, the first selection terminal is connected to an input terminal of the first transmit filter, the second selection terminal is connected to an input terminal of the second transmit filter, and the third selection terminal is connected to a receive path that transmits the receive signal of the third communication band.

Other features, elements, characteristics and advantages of the present disclosure will become more apparent from the following detailed description of embodiments of the present disclosure with reference to the attached drawings.

DETAILED DESCRIPTION

Hereinafter, an embodiment of the present disclosure will be described in detail with reference to the drawings. Note that the embodiment and modified examples, which will be described below, each illustrates a comprehensive or specific example. Numeric values, shapes, materials, constituting elements, arrangements and connection modes of the constituting elements, and the like illustrated in the following embodiment and modified examples are mere examples, and not intended to limit the present disclosure. Of constituting elements in the following embodiment and modified examples, the constituting elements that are not described in an independent claim will be described as optional constituting elements. Furthermore, dimensions or ratios of dimensions of constituting elements illustrated in the drawings are not necessarily be precise.

Embodiment

1. Circuit Configurations of Radio Frequency Module and Communication Device

Figure 1:
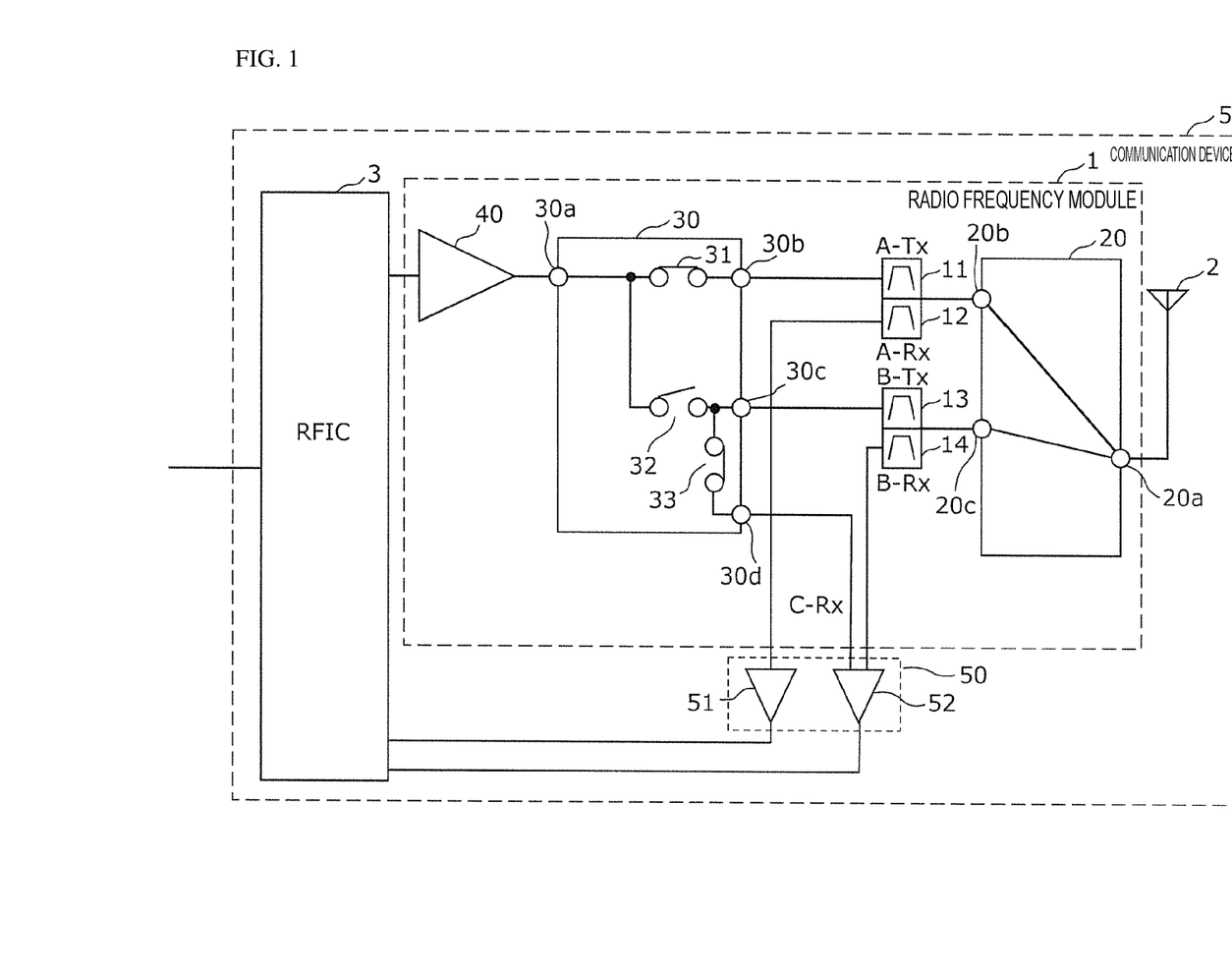
FIG. 1 is a circuit configuration diagram of a communication device according to an embodiment 1.

FIG. 1 is a circuit configuration diagram of a communication device 5 according to an embodiment. As illustrated in FIG. 1, the communication device 5 includes an antenna element 2, a radio frequency module 1, a receive amplifier circuit 50, and a RF signal processing circuit (RFIC) 3.

The RFIC 3 is an RF signal processing circuit that performs processing on radio frequency signals to be transmitted from and received by the antenna element 2. Specifically, the RFIC 3 performs signal processing on a radio frequency signal input via a receive path of the radio frequency module 1 using down-converting and the like, and outputs a receive signal generated by this signal processing to a baseband signal processing circuit (not illustrated). Furthermore, the RFIC 3 performs signal processing on a transmit signal input from the baseband signal processing circuit using up-converting and the like, and outputs a radio frequency signal generated by this signal processing to a transmit path of the radio frequency module 1.

Furthermore, the RFIC 3 also functions as a control unit that controls connections of switch circuits 20 and 30 included in the radio frequency module 1 based on a communication band (frequency band) to be used. Specifically, the RFIC 3 switches the connections of the switch circuits 20 and 30 included in the radio frequency module 1 using control signals (not illustrated). The control unit may alternatively be provided outside the RFIC 3, or may be provided, for example, inside the radio frequency module 1 or the baseband signal processing circuit.

The receive amplifier circuit 50 is made up of receive amplifiers 51 and 52. Of receive signals output from the radio frequency module 1, the receive amplifier 51 preferentially amplifies a receive signal of Band A (first communication band) and outputs the amplified receive signal to the RFIC 3. Of the receive signals output from the radio frequency module 1, the receive amplifier 52 preferentially amplifies receive signals of Band B (second communication band) and Band C (third communication band) and outputs these amplified receive signals to the RFIC 3.

The antenna element 2 is connected to a common terminal 20a of the switch circuit 20, emits a radio frequency signal output from the radio frequency module 1, and receives a radio frequency signal from outside and outputs to the radio frequency module 1.

Note that in the communication device 5 according to the present embodiment, the antenna element 2 is an optional constituting element.

Next, the configuration of the radio frequency module 1 is described in detail.

As illustrated in FIG. 1, the radio frequency module 1 includes transmit filters 11 and 13, receive filters 12 and 14, a transmit amplifier 40, and the switch circuits 20 and 30.

The radio frequency module 1 according to the present embodiment is a radio frequency module capable of transmitting a transmit signal and a receive signal of Band A (first communication band), a transmit signal and a receive signal of Band B (second communication band), and a receive signal of Band C (third communication band). Furthermore, the radio frequency module 1 is capable of performing (1) CA that simultaneously transmits a transmit signal of Band A and a transmit signal of Band B (two uplink), (2) CA that simultaneously transmits and receives a transmit signal of Band A and a receive signal of Band C (one uplink one downlink), (3) CA that simultaneously receives a receive signal of Band A and a receive signal of Band B (two downlink), (4) CA that simultaneously receives a receive signal of Band A and a receive signal of Band C (two downlink), (5) CA that simultaneously transmits and receives a transmit signal and a receive signal of Band A and a transmit signal and a receive signal of Band B (two uplink two downlink), and (6) CA that simultaneously transmits and receives a transmit signal and a receive signal of Band A and a receive signal of Band C (one uplink two downlink).

Figure 2:
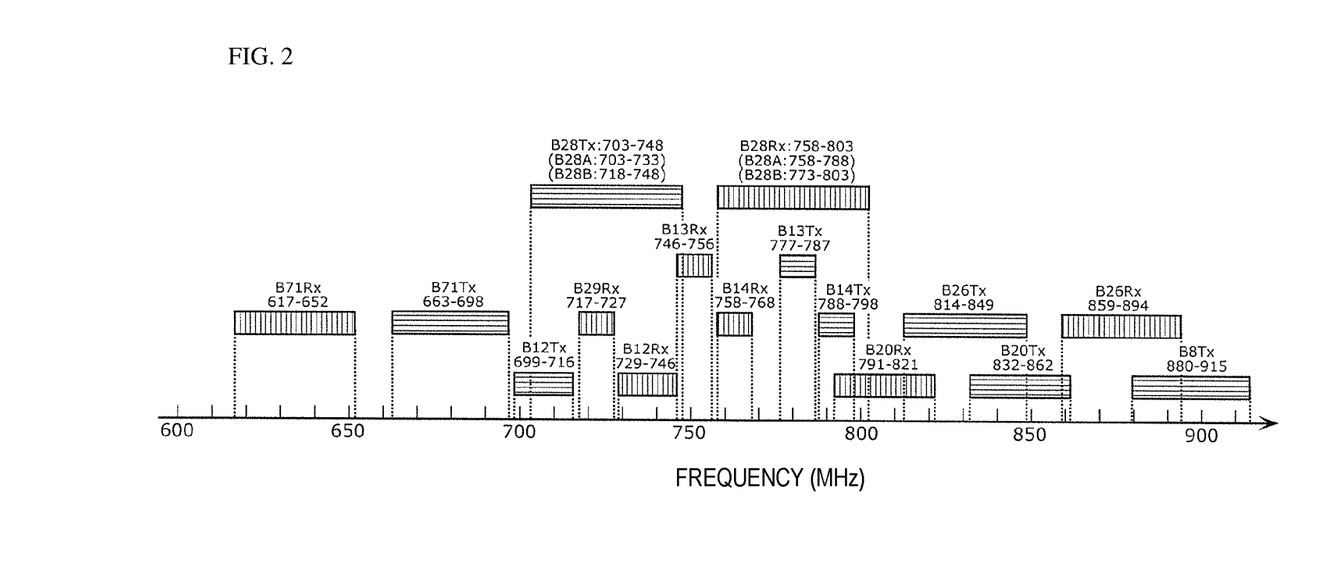
FIG. 2 is a diagram illustrating one example of frequency allocation of communication bands that can be used in the radio frequency module according to the embodiment 1.

FIG. 2 is a diagram illustrating one example of frequency allocation of communication bands that can be used in the radio frequency module 1 according to the embodiment. Band A (first communication band) in the present embodiment is, for example, Band 26 (transmit band: 814-849 MHz, receive band: 859-894 MHz) of Long Term Evolution (LTE). Band B (second communication band) is, for example, Band 28 (transmit band: 703-748 MHz, receive band: 758-803 MHz) of LTE. Band C (third communication band) is, for example, Band 29 (receive band: 717-727 MHz) of LTE.

As illustrated in FIG. 2, Band A (Band 26) and Band B (Band 28) each has a transmit band (Tx) and a receive band (Rx). Furthermore, Band C (Band 29) has only a receive band (Rx). Here, the transmit band of Band B (Band 28) includes the receive band of Band C (Band 29).

The radio frequency module 1 according to the present embodiment includes the filters that allow Bands A to C, which have the frequency relationship described above, to pass and the switches that switch signal paths of the respective communication bands.

The transmit filter 11 is a first transmit filter whose pass band is the transmit band of Band A (A-Tx). The receive filter 12 is a first receive filter whose pass band is the receive band of Band A (A-Rx).

The transmit filter 13 is a second transmit filter whose pass band is the transmit band of Band B (B-Tx). The receive filter 14 is a second receive filter whose pass band is the receive band of Band B (B-Rx). Note that the pass band of the transmit filter 13 includes the receive band of Band C (C-Rx).

The switch circuit 20 is a multi-connection type second switch circuit that includes the common terminal 20a (second common terminal), a selection terminal 20b (fifth selection terminal), and a selection terminal 20c (sixth selection terminal) and is capable of simultaneously forming a connection between the common terminal 20a and the selection terminal 20b and a connection between the common terminal 20a and the selection terminal 20c.

The selection terminal 20b is connected to an output terminal of the transmit filter 11 and an input terminal of the receive filter 12, and the selection terminal 20c is connected to an output terminal of the transmit filter 13 and an input terminal of the receive filter 14.

In the switch circuit 20, when at least one of the transmission of a transmit signal of Band A and the reception of a receive signal of Band A is performed, the common terminal 20a and the selection terminal 20b are in an electrically continuous state. Furthermore, when at least one of the transmission of a transmit signal of Band B, the reception of a receive signal of Band B, and the reception of a receive signal of Band C is performed, the common terminal 20a and the selection terminal 20c are in the electrically continuous state. This enables to disconnect the output terminal of the transmit filter 11 from the output terminal of the transmit filter 13 at the time of non-CA, thereby improving bandpass characteristics of a signal path selected at the time of non-CA.

The switch circuit 30 is a first switch circuit that includes a common terminal 30a (first common terminal), a selection terminal 30b (first selection terminal), a selection terminal 30c (second selection terminal), a selection terminal 30d (third selection terminal), and switches 31, 32, and 33.

The switch 31 is connected to the common terminal 30a at one terminal and to the selection terminal 30b at the other terminal and is a first switch that switches between being electrically continuous and electrically discontinuous between the common terminal 30a and the selection terminal 30b. The switch 31 is, for example, a single pole single throw (SPST) type switch element.

The switch 32 is connected to the common terminal 30a at one terminal and to the selection terminal 30c at the other terminal and is a second switch that switches between being electrically continuous and electrically discontinuous between the common terminal 30a and the selection terminal 30c. The switch 32 is, for example, a SPST type switch element.

The switch 33 is connected to the selection terminal 30c at one terminal and to the selection terminal 30d at the other terminal and is a third switch that switches between being electrically continuous and electrically discontinuous between the selection terminal 30c and the selection terminal 30d. The switch 33 is, for example, a SPST type switch element.

According to the foregoing configuration of the switch circuit 30, the switch circuit 30 is a multi-connection type switch circuit capable of simultaneously connecting two or more of four terminals, which are the common terminal 30a and the selection terminals 30b, 30c, and 30d.

Of transmit signals output from the RFIC 3, the transmit amplifier 40 preferentially amplifies transmit signals of Bands A and B and outputs these amplified transmit signals to the common terminal 30a of the switch circuit 30.

The common terminal 30a is connected to an output terminal of the transmit amplifier 40. The selection terminal 30b is connected to an input terminal of the transmit filter 11 and an output terminal of the receive filter 12. The selection terminal 30c is connected to an input terminal of the transmit filter 13 and an output terminal of the receive filter 14. The selection terminal 30d is connected to a receive path 61 that transmits a receive signal of Band C and is connected to the receive amplifier 52 via the receive path 61.

The selection terminal 20b is connected to the output terminal of the transmit filter 11 and the input terminal of the receive filter 12. The selection terminal 20c is connected to the output terminal of the transmit filter 13 and the input terminal of the receive filter 14. An input terminal of the receive amplifier 51 is connected to the output terminal of the receive filter 12. An input terminal of the receive amplifier 52 is connected to the output terminal of the receive filter 14.

Note that in the radio frequency module 1 according to the present embodiment, the receive filters 12 and 14 and the switch circuit 20 are optional constituting elements. Furthermore, in the communication device 5 according to the present embodiment, the antenna element 2 is an optional constituting element.

Figure 3:
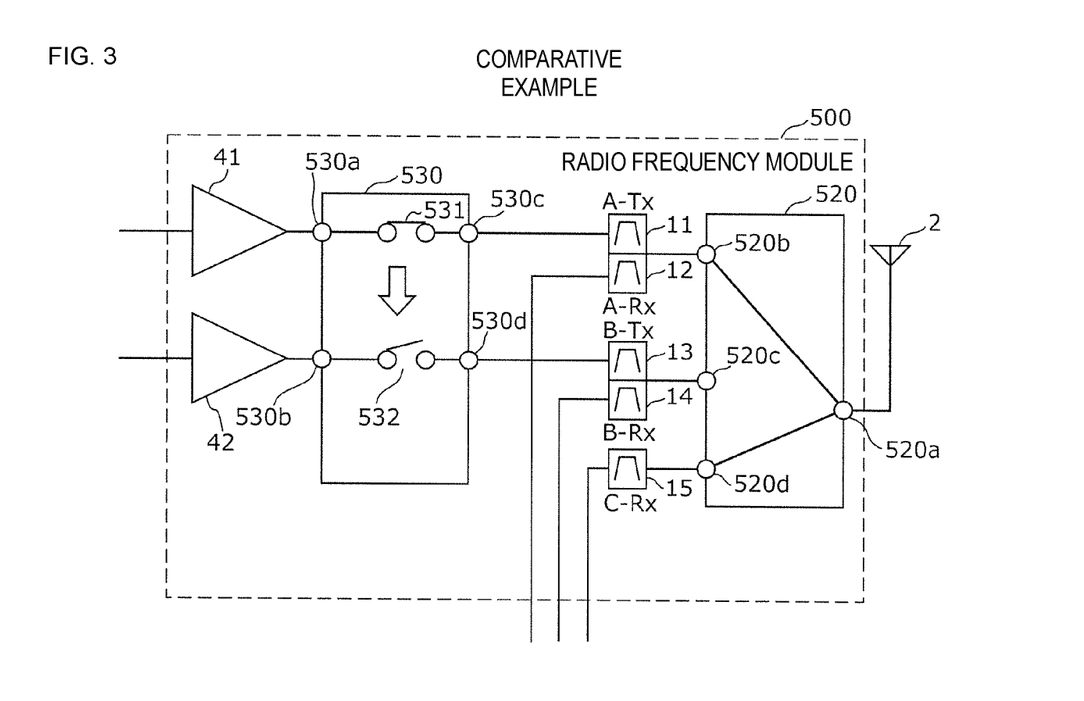
FIG. 3 is a circuit configuration diagram of a radio frequency module according to a comparative example.

FIG. 3 is a circuit configuration diagram of a radio frequency module 500 according to a comparative example. As illustrated in FIG. 3, the radio frequency module 500 is a radio frequency module that is typically assumed and includes transmit filters 11 and 13, receive filters 12, 14, and 15, transmit amplifiers 41 and 42, and the switch circuits 520 and 530. The radio frequency module 500 according to the present comparative example is different from the radio frequency module 1 according to the embodiment in that the receive filter 15 is added, two transmit amplifiers are installed, and the switch circuits 520 and 530 have different configurations. Hereinafter, the radio frequency module 500 according to the present comparative example is described with the emphasis on points different from the radio frequency module 1 according to the embodiment while omitting the description regarding the same point.

The receive filter 15 is a filter whose pass band is the receive band of Band C (C-Rx).

The switch circuit 520 is a multi-connection type switch circuit that includes a common terminal 520a and selection terminals 520b, 520c, and 520d and is capable of simultaneously forming at least two of a connection between the common terminal 520a and the selection terminal 520b, a connection between the common terminal 520a and the selection terminal 520c, and a connection between the common terminal 520a and the selection terminal 520d.

The selection terminal 520b is connected to an output terminal of the transmit filter 11 and an input terminal of the receive filter 12, the selection terminal 520c is connected to an output terminal of the transmit filter 13 and an input terminal of the receive filter 14, and the selection terminal 520d is connected to an input terminal of the receive filter 15.

The switch circuit 530 is a switch circuit that includes terminals 530a, 530b, 530c, and 530d and switches 531 and 532. The switch 531 is connected to the terminal 530a at one terminal and to the terminal 530c at the other terminal and switches between being electrically continuous and electrically discontinuous between the terminal 530a and the terminal 530c. The switch 532 is connected to the terminal 530b at one terminal and to the terminal 530d at the other terminal and switches between being electrically continuous and electrically discontinuous between the terminal 530*b* and the terminal 530*d*.

According to the foregoing configuration of the switch circuit 530, the switch circuit 530 is a multi-connection type switch circuit capable of simultaneously forming a connection between the terminal 530*a* and the terminals 530*c* and a connection between the terminal 530*b* and the terminal 530*d*.

Of radio frequency signals output from the RFIC 3, the transmit amplifier 41 preferentially amplifies a radio frequency signal of Band A and outputs this amplified transmit signal to the terminal 530*a*. Of radio frequency signals output from the RFIC 3, the transmit amplifier 42 preferentially amplifies a radio frequency signal of Band B and outputs this amplified transmit signal to the terminal 530*b*.

The terminal 530*a* is connected to an output terminal of the transmit amplifier 41. The terminal 530*b* is connected to an output terminal of the transmit amplifier 42. The terminal 530*c* is connected to an input terminal of the transmit filter 11. The terminal 530*d* is connected to an input terminal of the transmit filter 13.

According to the foregoing configuration of the radio frequency module 500 according to the comparative example, it becomes possible to transmit a transmit signal and a receive signal of Band A, a transmit signal and a receive signal of Band B, and a receive signal of Band C. Furthermore, the radio frequency module 500 can perform (1) CA that simultaneously transmits a transmit signal of Band A and a transmit signal of Band B (two uplink) and (5) CA that simultaneously transmits and receives a transmit signal and a receive signal of Band A and a transmit signal and a receive signal of Band B (two uplink two downlink) by setting the switches 531 and 532 to the electrically continuous state, connecting the common terminal 520*a* and the selection terminal 520*b*, and connecting the common terminal 520*a* and the selection terminal 520*c*. Furthermore, by setting the switch 531 to the electrically continuous state, connecting the common terminal 520*a* and the selection terminal 520*b*, and connecting the common terminal 520*a* and the selection terminal 520*d*, (2) CA that simultaneously transmits and receives a transmit signal of Band A and a receive signal of Band C (one uplink one downlink) and (6) CA that simultaneously transmits and receives a transmit signal and a receive signal of Band A and a receive signal of Band C (one uplink two downlink) can be performed. Furthermore, by connecting the common terminal 520*a* and the selection terminal 520*b* and connecting the common terminal 520*a* and the selection terminal 520*c*, (3) CA that simultaneously receives a receive signal of Band A and a receive signal of Band B (two downlink) can be performed. Furthermore, by connecting the common terminal 520*a* and the selection terminal 520*b* and connecting the common terminal 520*a* and the selection terminal 520*d*, (4) CA that simultaneously receives a receive signal of Band A and a receive signal of Band C (two downlink) can be performed.

However, in the radio frequency module 500 according to the comparative example, two transmit amplifiers are respectively installed for Bands A and B, and furthermore, the receive filter 15 only for use in the receive band of Band C is installed. This increases the size of the radio frequency module 500.

Whereas, since the receive band of Band C (C-Rx) is included in the transmit band of Band B (B-Tx), as a downsizing measure, it is conceivable to use the transmit filter of Band B also as the receive filter of Band C. Furthermore, in the case where a transmit amplifier capable of amplifying radio frequency signals of Band A and Band B is used, the number of the transmit amplifiers can be reduced compared with the radio frequency module 500 according to the comparative example, thereby achieving further downsizing.

The receive filter of Band C is a filter that allows a receive signal to pass. Therefore, in the case where the transmit filter of Band B is used also as the receive filter of Band C, it is suitable to connect the transmit filter of Band B and a receive amplifier circuit using a switch circuit at the time of using the transmit filter of Band B as the receive filter of Band C.

Furthermore, in the case where a transmit amplifier capable of amplifying radio frequency signals of Band A and Band B is installed, it is suitable to connect both the transmit filter of Band A and the transmit filter of Band B to the transmit amplifier.

Here, when a transmit signal of Band A and a receive signal of Band C are simultaneously transmitted and received, it is suitable to connect the transmit amplifier and the transmit filter of Band A and connect the transmit filter of Band B and a receive path that transmits a receive signal of Band C using the foregoing switch circuit. However, when the state where both the transmit filter of Band A and the transmit filter of Band B are connected to the transmit amplifier and the state where the transmit filter of Band B and a receive path of Band C are connected coexist, a transmit signal from the transmit amplifier is leaked into the foregoing receive path via the switch circuit. This leads to a problem of decreasing reception sensitivity in the receive path.

Whereas, according to the foregoing configuration of the radio frequency module 1 according to the present embodiment, the switch 32 is installed between the common terminal 30*a* and the selection terminal 30*c* and the switch 33 is installed between the selection terminal 30*c* and the selection terminal 30*d*. Therefore, when a transmit signal of Band A and a receive signal of Band C are simultaneously transmitted and received, the isolation between a transmit signal of Band A and a receive signal of Band C can be improved while using the transmit filter 13 as the filter that allows a transmit signal of Band C to pass by setting the switch 32 to an electrically discontinuous state and setting the switch 33 to the electrically continuous state. Furthermore, when a transmit signal of Band A and a transmit signal of Band B are non-simultaneously transmitted, even in the case where the single transmit amplifier 40 is used as both a transmit amplifier amplifying a radio frequency signal of Band A and a transmit amplifier amplifying a radio frequency signal of Band B by using switching operations of the switches 31 and 32, the isolation between a transmit signal of Band A and a transmit signal of Band B can be ensured. Accordingly, it becomes possible to suppress the decrease in reception sensitivity in Band C while downsizing the radio frequency module 1 and the communication device 5, each of which simultaneously transmits and receives a transmit signal of Band A and a receive signal of Band C and in which the receive band of Band C is included in the transmit band of Band B. That is to say, it becomes possible to provide a radio frequency module and a communication device, each of which is capable of performing CA using a plurality of communication bands including two communication bands in which a transmit band of one of the two communication bands and a receive band of the other communication band are in an inclusion relationship and in which the decrease in reception sensitivity is suppressed while downsizing.

The switch circuit 30 may alternatively be formed within a single switch IC. In the case where the switch circuit 30 is formed inside a single switch IC, downsizing can be achieved. However, in this case, gaps between the common terminal 30a and selection terminals 30b to 30d become narrower, and the isolation among radio frequency signals of the communication bands degrade. Whereas, according to the foregoing configuration of the switch circuit 30, the isolation between a transmit signal of Band A and a receive signal of Band C can be improved by setting the switch 32 to the electrically discontinuous state. Accordingly, it becomes possible to improve the reception sensitivity in Band C while downsizing the radio frequency module 1.

Furthermore, the switch circuits 20 and 30 and the foregoing control unit may constitute a single switch IC. This enables to shorten control wiring lines connecting the control unit and the switch circuits 20 and 30, and thus the degradation of control accuracy caused by interference between a control signal and a radio frequency signal can be suppressed. Furthermore, the radio frequency module 1 can be fabricated inexpensively by forming the switch IC using Si-based complementary metal oxide semiconductor (CMOS).

2. Circuit Operation of Radio Frequency Module

Figure 4A:
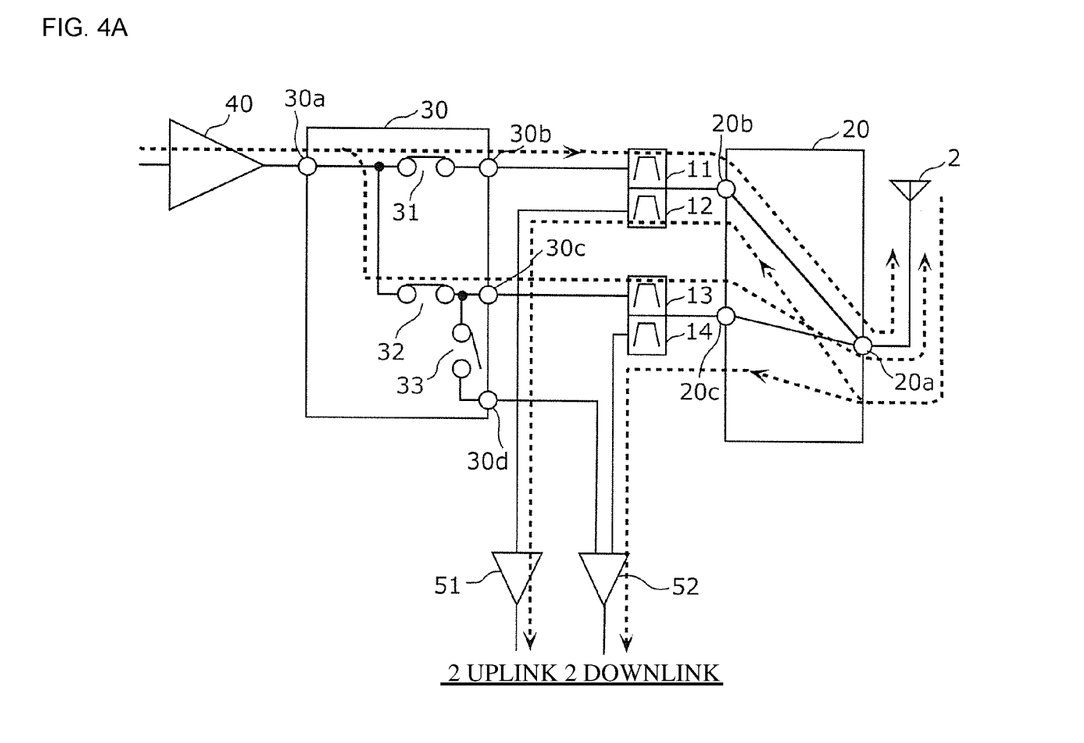
FIG. 4A is a diagram illustrating a circuit state of the radio frequency module according to the embodiment 1 when CA of Band A and Band B is performed.

FIG. 4A is a diagram illustrating a circuit state of the radio frequency module 1 according to the embodiment 1 when CA of Band A and Band B is performed. FIG. 4A illustrates the circuit state when CA is performed using a transmit signal and a receive signal of Band A and a transmit signal and a receive signal of Band B.

When a transmit signal and a receive signal of Band A and a transmit signal and a receive signal of Band B are simultaneously transmitted and received, the switches 31 and 32 are in the electrically continuous state, and the switch 33 is in the electrically discontinuous state. Furthermore, the common terminal 20a and the selection terminal 20b are connected, and the common terminal 20a and the selection terminal 20c are connected.

This allows a transmit signal of Band A to be transmitted to the antenna element 2 via the transmit amplifier 40, the common terminal 30a, the switch 31, the selection terminal 30b, the transmit filter 11, the selection terminal 20b, and the common terminal 20a. Furthermore, a transmit signal of Band B is transmitted to the antenna element 2 via the transmit amplifier 40, the common terminal 30a, the switch 32, the selection terminal 30c, the transmit filter 13, the selection terminal 20c, and the common terminal 20a.

Here, since the switch 33 is in the electrically discontinuous state, it becomes possible to suppress the leakage of a transmit signal of Band A and a transmit signal of Band B into the receive path of Band C. Thus, a transmit signal of Band A and a transmit signal of Band B can be transmitted to the antenna element 2 with less loss.

Furthermore, a receive signal of Band A is transmitted to the RFIC 3 via the antenna element 2, the common terminal 20a, the selection terminal 20b, the receive filter 12, and the receive amplifier 51. Furthermore, a receive signal of Band B is transmitted to the RFIC 3 via the antenna element 2, the common terminal 20a, the selection terminal 20c, the receive filter 14, and the receive amplifier 52.

Figure 4B:
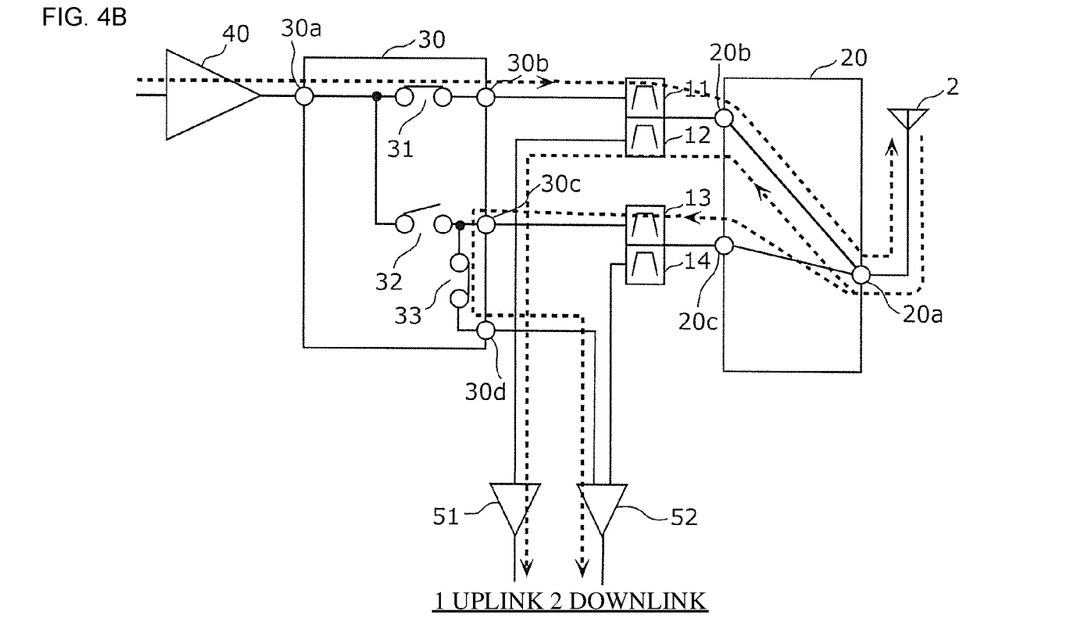
FIG. 4B is a diagram illustrating a circuit state of the radio frequency module according to the embodiment 1 when CA of Band A and Band C is performed.

FIG. 4B is a diagram illustrating a circuit state of the radio frequency module 1 according to the embodiment 1 when CA of Band A and Band C is performed. FIG. 4B illustrates the circuit state when CA is performed using a transmit signal and a receive signal of Band A and a receive signal of Band C.

When a transmit signal and a receive signal of Band A and a receive signal of Band C are simultaneously transmitted and received, the switches 31 and 33 are in the electrically continuous state, and the switch 32 is in the electrically discontinuous state. Furthermore, the common terminal 20a and the selection terminal 20b are connected, and the common terminal 20a and the selection terminal 20c are connected.

This allows a transmit signal of Band A to be transmitted to the antenna element 2 via the transmit amplifier 40, the common terminal 30a, the switch 31, the selection terminal 30b, the transmit filter 11, the selection terminal 20b, and the common terminal 20a.

Here, since the switch 32 is in the electrically discontinuous state, it becomes possible to suppress the leakage of a transmit signal output from the transmit amplifier 40 into a transmit path of Band B and the receive path of Band C. Therefore, it becomes possible to suppress the coupling of a radio frequency component of Band B (and Band C), which is transmitted in the transmit path of Band B, with a transmit signal of Band A, which is transmitted through the transmit path of Band A and output to the antenna element 2, within the switch circuit 20. Furthermore, it becomes possible to suppress the inflow of a transmit signal output from the transmit amplifier 40 into the receive path of Band C.

Furthermore, a receive signal of Band A is transmitted to the RFIC 3 via the antenna element 2, the common terminal 20a, the selection terminal 20b, the receive filter 12, and the receive amplifier 51. Furthermore, a receive signal of Band C is transmitted to the RFIC 3 via the antenna element 2, the common terminal 20a, the selection terminal 20c, the transmit filter 13, the selection terminal 30c, the switch 33, the selection terminal 30d, and the receive amplifier 52.

As illustrated in FIG. 4A and FIG. 4B, with the foregoing connection states of the switch circuits 20 and 30, it become possible to switch between CA that uses a transmit signal and a receive signal of Band A and a transmit signal and a receive signal of Band B (two uplink two downlink) and CA that uses a transmit signal and a receive signal of Band A and a receive signal of Band C (one uplink two downlink).

Although it is not illustrated, when a transmit signal of Band A and a transmit signal of Band B are simultaneously transmitted, the switches 31 and 32 are in the electrically continuous state, and the switch 33 is in the electrically discontinuous state. Furthermore, when a transmit signal of Band A and a receive signal of Band C are simultaneously transmitted and received, the switches 31 and 33 are in the electrically continuous state, and the switch 32 is in the electrically discontinuous state. In either case, the common terminal 20a and the selection terminal 20b are connected, and the common terminal 20a and the selection terminal 20c are connected.

Because of this, it becomes possible to switch between CA that uses a transmit signal of Band A and a receive signal of Band C (one uplink one downlink) and CA that uses a transmit signal of Band A and a transmit signal of Band B (two uplink) using the switch circuits 20 and 30.

Although it is not illustrated, when a receive signal of Band A and a receive signal of Band B are simultaneously received, the switch 33 is in the electrically discontinuous state. Furthermore, when a receive signal of Band A and a receive signal of Band C are simultaneously received, the switch 33 is in the electrically continuous state. In either case, the common terminal 20a and the selection terminal 20b are connected, and the common terminal 20a and the selection terminal 20c are connected.

Because of this, it becomes possible to switch between CA that uses a receive signal of Band A and a receive signal of Band B (two downlink) and CA that uses a receive signal of Band A and a receive signal of Band C (two downlink) using the switch circuits 20 and 30.

3. Radio Frequency Module According to Modified Example 1

Figure 5:
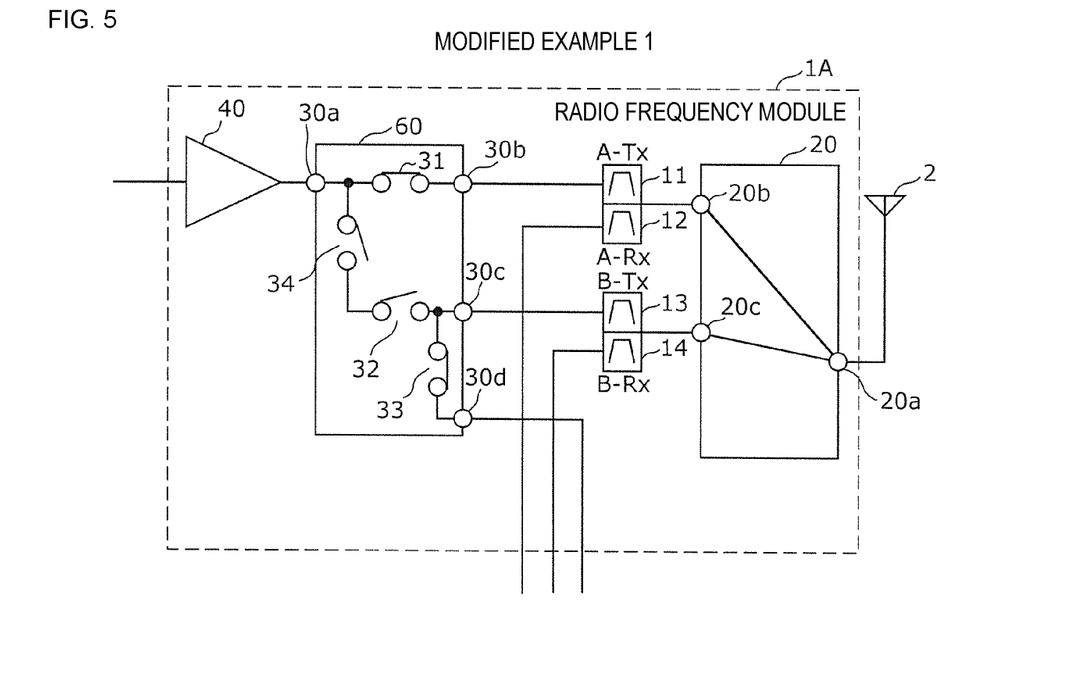
FIG. 5 is a circuit configuration diagram of a radio frequency module according to a modified example 1 of the embodiment.

FIG. 5 is a circuit configuration diagram of a radio frequency module 1A according to a modified example 1 of the embodiment. As illustrated in FIG. 5, the radio frequency module 1A includes transmit filters 11 and 13, receive filters 12 and 14, a transmit amplifier 40, and the switch circuits 20 and 60. The radio frequency module 1A according to the present modified example is different from the radio frequency module 1 according to the embodiment in the configuration of the switch circuit 60. Hereinafter, the radio frequency module 1A according to the present modified example is described with the emphasis on points different from the radio frequency module 1 according to the embodiment while omitting the description regarding the same points.

The switch circuit 60 is a first switch circuit that includes a common terminal 30a (first common terminal), a selection terminal 30b (first selection terminal), a selection terminal 30c (second selection terminal), a selection terminal 30d (third selection terminal), and switches 31, 32, 33, and 34.

The switch 31 is connected to the common terminal 30a at one terminal and to the selection terminal 30b at the other terminal and is a first switch that switches between being electrically continuous and electrically discontinuous between the common terminal 30a and the selection terminal 30b. The switch 31 is, for example, a SPST type switch element.

The switch 32 is connected to the switch 34 at one terminal and to the selection terminal 30c at the other terminal and is part of a second switch that switches between being electrically continuous and electrically discontinuous between the common terminal 30a and the selection terminal 30c. The switch 32 is, for example, a SPST type switch element.

The switch 34 is connected to the common terminal 30a at one terminal and to the switch 32 at the other terminal and is part of the second switch that switches between being electrically continuous and electrically discontinuous between the common terminal 30a and the selection terminal 30c. The switch 34 is, for example, a SPST type switch element.

The switches 32 and 34 are two switch elements connected in series to each other and constitute the second switch that switches between being electrically continuous and electrically discontinuous between the common terminal 30a and the selection terminal 30c. Note that in the radio frequency module 1A according to the present modified example 1, the switches connected in series between the common terminal 30a and the selection terminal 30c are not limited to two switch elements, such as the switches 32 and 34 and may be any two or more switch elements connected in series.

The switch 33 is connected to the selection terminal 30c at one terminal and to the selection terminal 30d at the other terminal and is a third switch that switches between being electrically continuous and electrically discontinuous between the selection terminal 30c and the selection terminal 30d. The switch 33 is, for example, a SPST type switch element.

According to the foregoing configuration of the switch circuit 60, the switch circuit 60 is a multi-connection type switch circuit capable of simultaneously connecting two or more of four terminals, which are the common terminal 30a and the selection terminals 30b, 30c, and 30d.

Note that the switches 32 and 34 are in the electrically continuous state simultaneously or in the electrically discontinuous state simultaneously. That is to say, the switches 32 and 34 function as the single second switch.

According to the foregoing configuration, the second switch is installed between the common terminal 30a and the selection terminal 30c. However, this second switch is made up of two switches 32 and 34 that are connected in series. This enables further suppression of the leakage of a radio frequency signal output from the transmit amplifier 40 into the transmit path of Band B and the receive path of Band C when the second switch is set to the electrically discontinuous state. Therefore, it becomes possible to further improve the isolation between a transmit signal of Band A and a receive signal of Band C. Accordingly, it becomes possible to further improve the reception sensitivity in Band C while downsizing the radio frequency module 1A.

Figure 6:
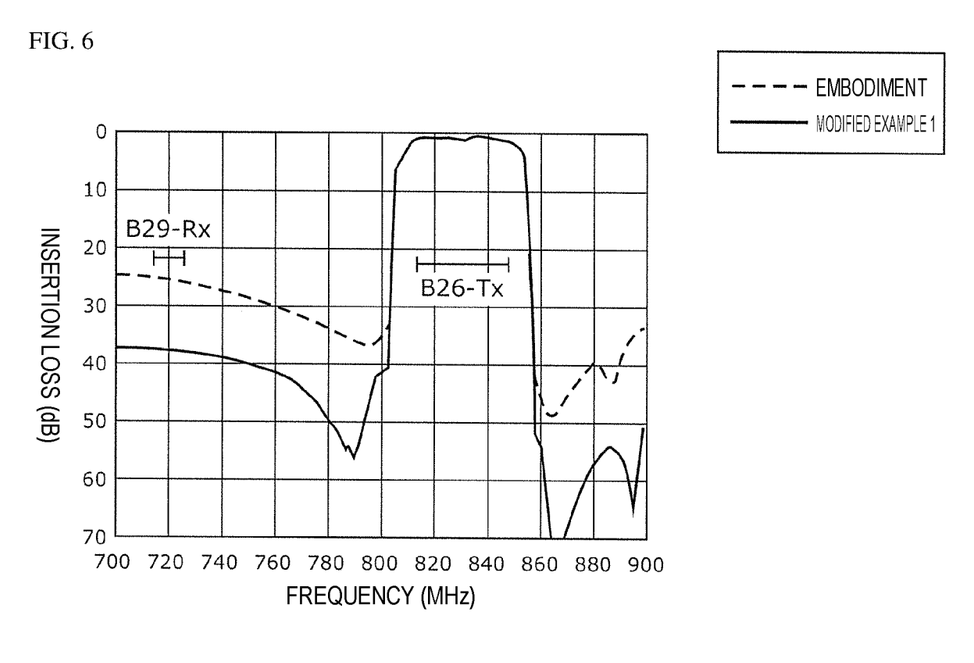
FIG. 6 is a graph that compares bandpass characteristics of the radio frequency modules according to the modified example 1 and the embodiment.

FIG. 6 is a graph that compares bandpass characteristics of the radio frequency modules according to the modified example 1 and the embodiment. FIG. 6 illustrates bandpass characteristics from the common terminal 30a to the common terminal 20a inclusive of the transmit filter 11 in the radio frequency module 1 according to the embodiment and the radio frequency module 1A according to the modified example 1. Note that the switch 31 is in the electrically continuous state, the switches 32 and 34 are in the electrically discontinuous state, and the common terminal 20a and the selection terminal 20b are connected. Furthermore, Band 26 of LTE is used as Band A, Band 28 of LTE is used as Band B, and Band 29 of LTE is used as Band C.

In the radio frequency modules according to the embodiment and the modified example 1, no difference can be seen in the insertion loss in the transmit band of Band A (B26-Tx). Whereas, with regard to the attenuation characteristic in Band C (B29-Rx), the radio frequency module 1A according to the modified example 1 provides a better performance than the radio frequency module 1 according to the embodiment. The radio frequency module 1 according to the embodiment provides an attenuation of about 25 dB in Band C (B29-Rx), whereas the radio frequency module 1A according to the modified example 1 provides an attenuation of about 38 dB in Band C (B29-Rx).

When a transmit signal of Band A and a receive signal of Band C are simultaneously transmitted and received, the switches 31 and 33 are in the electrically continuous state, and the switch 32 (second switch) is in the electrically discontinuous state. In this case, a transmit signal output from the transmit amplifier 40 is output to the antenna element 2 after passing the transmit path of Band A and the transmit filter 11 via the switch 31 in the electrically continuous state. At the same time, here, part of the transmit signal output from the transmit amplifier 40 flows into the transmit path of Band B and the receive path of Band C via the switch 32 (second switch) in the electrically discontinuous state, and an unwanted wave having a frequency component of Band B (and Band C) that has entered therein flows further into the transmit path of Band A via the switch circuit 20 and the like. That is to say, in the bandpass characteristics from the common terminal 30a to the common terminal 20a inclusive of the transmit filter 11, the attenuation characteristic in Band B (and Band C) is affected by isolation performance of the switch 32 in the electrically discontinuous state.

The radio frequency module 1A according to the modified example 1 improves the isolation performance of the second switch in the electrically discontinuous state by making up the second switch, which switches the connection between the common terminal 30a and the selection terminal 30c, from two switches 32 and 34 connected in series. This enables to suppress the inflow of a transmit signal output from the transmit amplifier 40 into the transmit path of Band B and the receive path of Band C via the second switch in the electrically discontinuous state.

Accordingly, when a transmit signal of Band A and a receive signal of Band C are simultaneously transmitted and received, it becomes possible to further improve the isolation between the transmit signal of Band A and the receive signal of Band C. Accordingly, it becomes possible to further improve the reception sensitivity in Band C while downsizing the radio frequency module 1A.

4. Radio Frequency Module According to Modified Example 2

Figure 7:
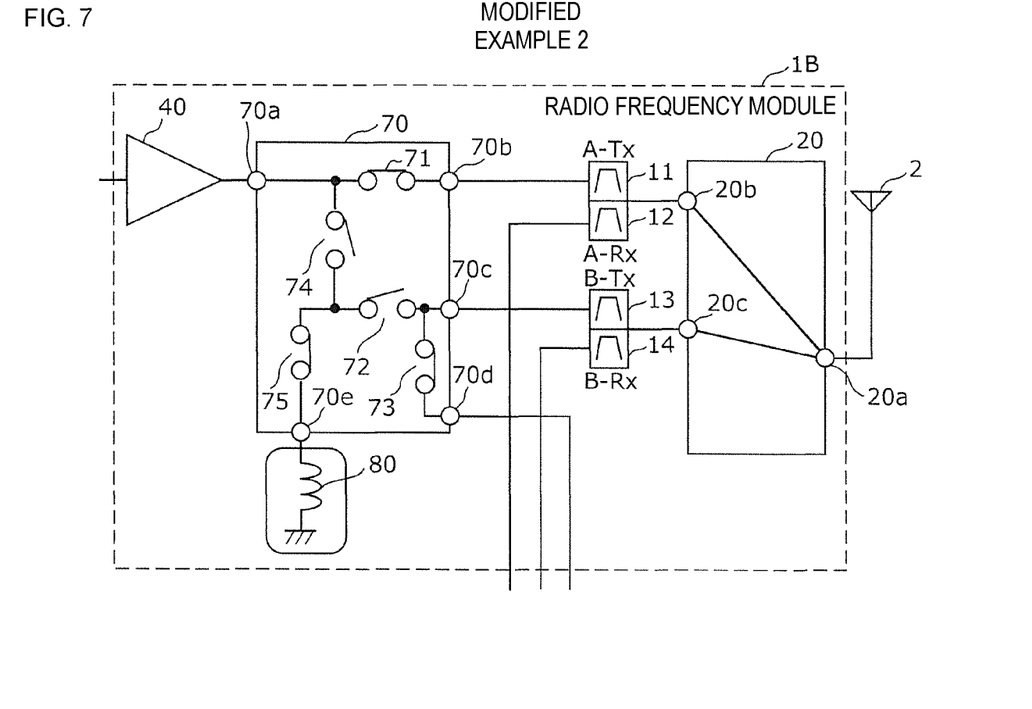
FIG. 7 is a circuit configuration diagram of a radio frequency module according to a modified example 2 of the embodiment.

FIG. 7 is a circuit configuration diagram of a radio frequency module 1B according to a modified example 2 of the embodiment. As illustrated in FIG. 7, the radio frequency module 1B includes transmit filters 11 and 13, receive filters 12 and 14, a transmit amplifier 40, the switch circuits 20 and 70, and an inductor 80. The radio frequency module 1B according to the present modified example is different from that radio frequency module 1A according to the modified example 1 in that the switch circuit 70 has a different configuration and the inductor 80 is added. Hereinafter, the radio frequency module 1B according to the present modified example is described with the emphasis on points different from the radio frequency module 1A according to the modified example 1 while omitting the description regarding the same points.

The switch circuit 70 is a first switch circuit that includes a common terminal 70a (first common terminal), a selection terminal 70b (first selection terminal), a selection terminal 70c (second selection terminal), a selection terminal 70d (third selection terminal), a selection terminal 70e (fourth selection terminal), and switches 71, 72, 73, 74, and 75.

The switch 71 is connected to the common terminal 70a at one terminal and to the selection terminal 70b at the other terminal and is a first switch that switches between being electrically continuous and electrically discontinuous between the common terminal 70a and the selection terminal 70b. The switch 71 is, for example, a SPST type switch element.

The switch 72 is connected to the switch 74 at one terminal and to the selection terminal 70c at the other terminal and is part of a second switch that switches between being electrically continuous and electrically discontinuous between the common terminal 70a and the selection terminal 70c. The switch 72 is, for example, a SPST type switch element.

The switch 74 is connected to the common terminal 70a at one terminal and to the switch 72 at the other terminal and is part of the second switch that switches between being electrically continuous and electrically discontinuous between the common terminal 70a and the selection terminal 70c. The switch 74 is, for example, a SPST type switch element.

The switch 73 is connected to the selection terminal 70c at one terminal and to the selection terminal 70d at the other terminal and is a third switch that switches between being electrically continuous and electrically discontinuous between the selection terminal 70c and the selection terminal 70d. The switch 73 is, for example, a SPST type switch element.

The switch 75 is connected to a connection point of the switches 72 and 74 at one terminal and to the selection terminal 70e at the other terminal and is a fourth switch that switches between being electrically continuous and electrically discontinuous between this connection point and the selection terminal 70e. The switch 75 is, for example, a SPST type switch element.

Note that the one terminal of the switch 75 is not necessarily connected to the foregoing connection point and may alternatively be connected to the common terminal 70a or the selection terminal 70c.

The inductor 80 is connected to the selection terminal 70e at one terminal and to ground at the other terminal. Note that the other terminal of the inductor 80 may not necessarily be connected to the ground.

When a transmit signal of Band A and a receive signal of Band C are simultaneously transmitted and received, the switches 71 and 73 are in the electrically continuous state, and the switches 72 and 74 are in the electrically discontinuous state. In this case, a transmit signal output from the transmit amplifier 40 is output to the antenna element 2 after passing the transmit path of Band A and the transmit filter 11 via the switch 71 in the electrically continuous state. At the same time, here, part of the transmit signal output from the transmit amplifier 40 flows into the transmit path of Band B and the receive path of Band C via the switches 72 and 74 that are in the electrically discontinuous state, and an unwanted wave having a frequency component of Band B (and Band C) that has entered therein degrades the reception sensitivity in Band C.

Whereas, in the radio frequency module 1B according to the present modified example, OFF capacitances of the switches 72 and 74 and the inductor 80 constitute a filter in a path connecting the common terminal 70a and the selection terminal 70c. Here, adjusting the inductance value of the inductor 80 enables the foregoing filter to have the bandpass characteristics whose attenuation band is Band C.

Because of this, when CA is performed using a transmit signal of Band A and a receive signal of Band C, by setting the switches 71 and 73 to the electrically continuous state, setting the switches 72 and 74 to the electrically discontinuous state, and setting the switch 75 to the electrically continuous state, it becomes possible to attenuate an unwanted signal having a frequency component of Band C that has leaked through the switches 72 and 74 and is moving toward the selection terminal 70c using the filter made up of the inductor 80 and the switches 72 and 74. Accordingly, it becomes possible to further improve the reception sensitivity in Band C.

Figure 7A:
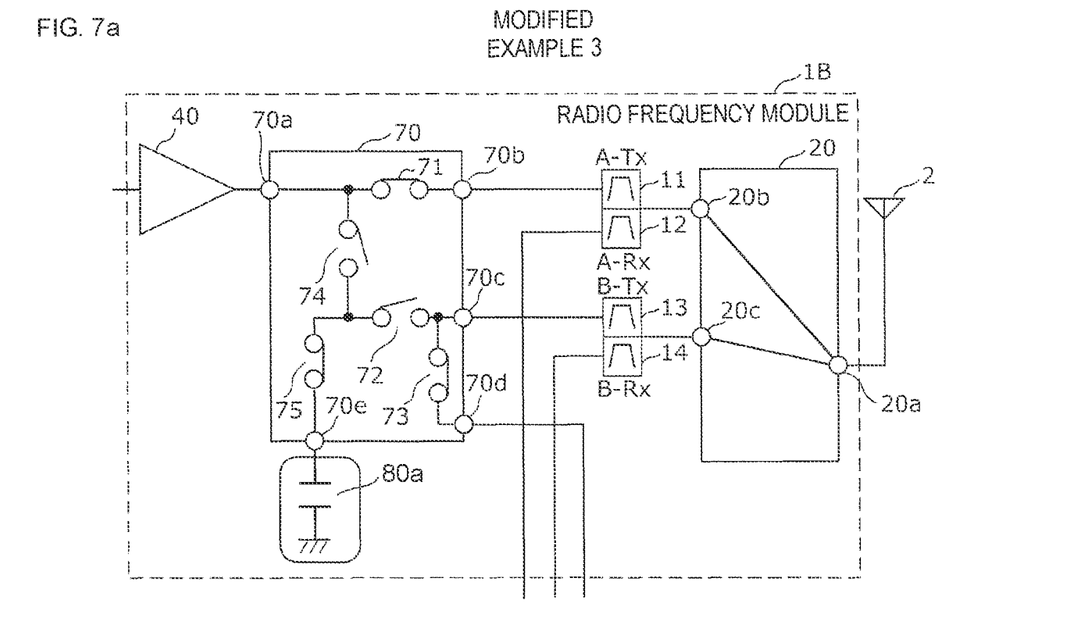
FIG. 7a is a circuit configuration diagram of a radio frequency module according to a modified example 3 of the embodiment.

Note that the circuit element connected to the selection terminal 70e is not limited to the inductor 80. Any circuit element may be connected to the selection terminal 70e provided that the circuit element is a suitable circuit element to have a filter function that attenuates an unwanted signal in a frequency band of Band C in the path connecting the common terminal 70a and the selection terminal 70c. The foregoing suitable circuit element is, for example, at least one of an inductor and a capacitor 80a, as illustrated in modified example 3 in FIG. 7a.

Other Embodiment

The radio frequency modules and the communication device according to the present disclosure are described using the embodiment and the modified examples. However, the present disclosure are not limited to the foregoing embodiment and the modified examples. Other embodiments realized by combining arbitrary constituting elements of the foregoing embodiment and modified examples, modified examples obtained by applying various modifications apparent to those skilled in the art to the foregoing embodiment and modified examples without necessarily departing the scope of the present disclosure, and various devices including a radio frequency module and a communication device according to the present disclosure may also be included in the present disclosure.

Furthermore, for example, in the radio frequency modules and the communication devices according to the embodiment and the modified examples, a matching element, such as an inductor, a capacitor, or the like, or a switch circuit may be connected between constituting elements. Note that the inductor may include a wiring line inductor formed by a wiring line connecting constituting elements.

The present disclosure can be widely used in communication equipment, such as cellular phones and the like as a radio frequency module and a communication device applicable to a multiband system performing CA.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio frequency module configured to transmit radio frequency signals of a first communication band, a second communication band, and a third communication band, the first, second, and third communication bands being different from one another,
a transmit band of the second communication band comprising a receive band of the third communication band, and
a transmit signal of the first communication band and a receive signal of the third communication band being simultaneously transmittable and receivable,
the radio frequency module comprising:
a first transmit filter having a pass band comprising a transmit band of the first communication band;
a second transmit filter having a pass band comprising the transmit band of the second communication band;
a transmit amplifier configured to amplify radio frequency signals of the transmit band of the first communication band and of the transmit band of the second communication band; and
a first switch circuit, wherein:
the first switch circuit comprises:
a first common terminal, a first selection terminal, a second selection terminal, and a third selection terminal,
a first switch configured to selectively connect the first common terminal and the first selection terminal,
a second switch configured to selectively connect the first common terminal and the second selection terminal, and
a third switch configured to selectively connect the second selection terminal and the third selection terminal,
the first common terminal is connected to an output terminal of the transmit amplifier,
the first selection terminal is connected to an input terminal of the first transmit filter,
the second selection terminal is connected to an input terminal of the second transmit filter, and
the third selection terminal is connected to a receive path configured to transmit the receive signal of the third communication band.

2. The radio frequency module according to claim 1, wherein in the first switch circuit, when the transmit signal of the first communication band and the receive signal of the third communication band are simultaneously transmitted and received:
the first common terminal and the first selection terminal are connected by the first switch,
the second selection terminal and the third selection terminal are connected by the third switch, and
the first common terminal and the second selection terminal are not connected by the second switch.

3. The radio frequency module according to claim 2, wherein in the first switch circuit, when the transmit signal of the first communication band and a transmit signal of the second communication band are simultaneously transmitted:
the first common terminal and the first selection terminal are connected by the first switch,
the first common terminal and the second selection terminal are connected by the second switch, and
the second selection terminal and the third selection terminal are not connected by the third switch.

4. The radio frequency module according to claim 1, further comprising:
a first receive filter having a pass band comprising a receive band of the first communication band, wherein:
an input terminal of the first receive filter is connected to an output terminal of the first transmit filter, and
when a receive signal of the first communication band and the receive signal of the third communication band are simultaneously received, the second selection terminal and the third selection terminal are connected by the third switch.

5. The radio frequency module according to claim 4, further comprising:
a second receive filter having a pass band comprising a receive band of the second communication band, wherein:
an input terminal of the second receive filter is connected to an output terminal of the second transmit filter, and
when the receive signal of the first communication band and a receive signal of the second communication band are simultaneously received, the second selection terminal and the third selection terminal are not connected by the third switch.

6. The radio frequency module according to claim 5, wherein:
when the transmit signal and the receive signal of the first communication band, and a transmit signal and the receive signal of the second communication band, are simultaneously transmitted and received:
the first common terminal and the first selection terminal are connected by the first switch, the first common terminal and the second selection terminal are connected by the second switch, and the second selection terminal and the third selection terminal are not connected by the third switch; and when the transmit signal and the receive signal of the first communication band, and the receive signal of the third communication band, are simultaneously transmitted and received, the first common terminal and the first selection terminal are connected by the first switch, the second selection terminal and the third selection terminal are connected by the third switch, and the first common terminal and the second selection terminal are not connected by the second switch.

7. The radio frequency module according to claim 1, wherein the second switch comprises two or more switch elements connected to each other in series.

8. The radio frequency module according to claim 1, further comprising:
an inductor or a capacitor, wherein:
the first switch circuit further comprises:
a fourth selection terminal, and
a fourth switch configured to selectively connect the second switch and the fourth selection terminal, and
the inductor or capacitor is connected to the fourth selection terminal.

9. The radio frequency module according to claim 1, wherein the first switch circuit is inside a switch integrated circuit.

10. The radio frequency module according to claim 1, further comprising:
a second switch circuit comprising a second common terminal, a fifth selection terminal, and a sixth selection terminal, wherein:

the fifth selection terminal is connected to an output terminal of the first transmit filter, the sixth selection terminal is connected to an output terminal of the second transmit filter, when transmission of the transmit signal of the first communication band or reception of a receive signal of the first communication band is performed, the second common terminal and the fifth selection terminal are connected by the second switch circuit, and when a transmit signal of the second communication band is transmitted, a receive signal of the second communication band is received, or the receive signal of the third communication band is received, the second common terminal and the sixth selection terminal are connected by the second switch circuit.

11. The radio frequency module according to claim 1, wherein:
the first communication band is Band 26 of Long Term Evolution (LTE),
the second communication band is Band 28 of LTE, and
the third communication band is Band 29 of LTE.

12. A communication device comprising:
a radio frequency (RF) signal processing circuit configured to process a radio frequency signal transmitted from or received by an antenna;
a receive amplifier circuit configured to amplify radio frequency signals of a receive band of the first communication band, a receive band of the second communication band, and the receive band of the third communication band; and
the radio frequency module according to claim 1 configured to transmit a radio frequency signal between the antenna and the RF signal processing circuit.

* * * * *